US008122945B2

(12) United States Patent
Kuo et al.

(10) Patent No.: US 8,122,945 B2
(45) Date of Patent: Feb. 28, 2012

(54) HEAT DISSIPATION DEVICE WITH BASE HAVING FASTENERS

(75) Inventors: Jer-Haur Kuo, Taipei Hsien (TW); Xin-Xiang Zha, Shenzhen (CN); Ye-Fei Yu, Shenzhen (CN); Lin Yang, Shenzhen (CN); Fang-Xiang Yu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 784 days.

(21) Appl. No.: 12/248,006

(22) Filed: Oct. 8, 2008

(65) Prior Publication Data

US 2009/0296347 A1    Dec. 3, 2009

(30) Foreign Application Priority Data

May 28, 2008    (CN) .......................... 2008 1 0067520

(51) Int. Cl.
*F28F 7/00* (2006.01)
*H05K 7/20* (2006.01)
*F16B 15/00* (2006.01)

(52) U.S. Cl. ........ 165/80.3; 361/700; 361/704; 411/999
(58) Field of Classification Search ................. 165/80.3; 361/700, 704; 411/999, 965, 107, 352, 544, 411/104
See application file for complete search history.

(56) References Cited

U.S. PATENT DOCUMENTS 3,700,020 A * 10/1972 Wallace ........................ 411/512
(Continued)

*Primary Examiner* — Cheryl J Tyler
*Assistant Examiner* — Brandon M Rosati
(74) *Attorney, Agent, or Firm* — Altis Law Group, Inc.

(57) ABSTRACT

A securing device includes a securing member defining a securing hole therein, and a fastener extending through the securing hole. The fastener includes a spring, and a bolt having a main portion, a bottom fixing portion, and a top head portion. The securing hole includes a large portion, a small portion, and a concave around the small portion. A diameter of the small portion is greater than the main portion and smaller than the fixing portion. A diameter of the large portion is greater than the fixing portion and smaller than the spring. The main portion extends through the small portion with the fixing portion tightly abutting the securing member. The spring is mounted around the main portion and received in the concave. The spring is compressed between the head portion and a step of the securing member in the concave.

11 Claims, 6 Drawing Sheets

U.S. PATENT DOCUMENTS

| | | | | |
|---|---|---|---|---|
| 3,888,064 A * | 6/1975 | Basile | | 403/408.1 |
| 4,877,364 A * | 10/1989 | Sorrentino | | 411/337 |
| 5,603,594 A * | 2/1997 | Lincoln | | 411/84 |
| 7,142,422 B2 | 11/2006 | Lee et al. | | |
| 7,609,522 B2 * | 10/2009 | Jin et al. | | 361/710 |
| 7,764,503 B2 * | 7/2010 | Zha | | 361/704 |
| 7,885,072 B2 * | 2/2011 | Wu et al. | | 361/700 |
| 7,990,722 B2 * | 8/2011 | Cao et al. | | 361/721 |
| 8,009,428 B1 * | 8/2011 | Ye | | 361/710 |
| 2003/0159819 A1 * | 8/2003 | Lee | | 165/185 |
| 2006/0232944 A1 | 10/2006 | Zhang et al. | | |
| 2007/0217159 A1 * | 9/2007 | Long et al. | | 361/704 |
| 2008/0050196 A1 * | 2/2008 | Cao et al. | | 411/107 |
| 2008/0130233 A1 * | 6/2008 | Jin et al. | | 361/704 |
| 2008/0158827 A1 * | 7/2008 | Yang | | 361/719 |
| 2008/0316707 A1 * | 12/2008 | Liu | | 361/700 |

* cited by examiner

HEAT DISSIPATION DEVICE WITH BASE HAVING FASTENERS

BACKGROUND

1. Field of the Disclosure

The disclosure generally relates to a heat dissipation device, and particularly to a securing structure of the heat dissipation device.

2. Description of Related Art

With the continuing development of the electronic technology, electronic packages, such as CPUs, are generating more and more heat which requires immediate dissipation. A thermal module is usually mounted on the electronic component for dissipating heat generated thereby, and a plurality of mounting elements are needed for securing the thermal module onto the electronic component. Generally each mounting element includes a bolt defining an annular groove near a bottom thereof, a spring disposed around a top of the bolt, and a ring-like clipping member capable of being snapped in the groove. After the bolts extend through the thermal module, the clipping members expand radially and outwardly to snap in the grooves of the bolts, thereby pre-assembling the bolts to the thermal module.

However, during the pre-assembling process, there is no mechanism formed in the bolts which can reliably ensure the snapping of the clipping members into the grooves of the bolts; the clipping members may be mounted to screwed end portions of the bolts if the clipping members are not aligned with the grooves. When this happens, the clipping members could drop from the bolts during transportation of the pre-assembled thermal module. In addition, after the thermal module is assembled to the electronic component, the clipping members are no longer needed. As the clipping members are made of metal with good resiliency, a cost of the thermal module is increased by using the clipping members.

For the foregoing reasons, therefore, there is a need in the art for a securing structure of the heat dissipation device which overcomes the above-mentioned problems.

SUMMARY

According to an exemplary embodiment of the disclosure, a heat dissipation device includes a base forming a number of securing member, and a number of fasteners. Each fastener includes a bolt and a spring. The bolt includes a main portion, a fixing portion formed at a bottom end of the main portion with a diameter greater than that of the main portion, and a head portion formed at a top end of the main portion with a diameter greater than that of the fixing portion. The spring is mounted around the main portion of the bolt. Each securing member defines a securing hole therein. Each securing hole includes a large portion, a small portion communicating with the large portion, and a concave depressed from a top side of the securing member around the small portion. A diameter of the small portion is greater than that of the main portion and smaller than that of the fixing portion of the bolt. A diameter of the large portion is greater than that of the fixing portion and smaller than that of the spring. The main portion of the bolt extends through the small portion with the fixing portion abutting a bottom side of the securing member. The spring is received in the concave of the securing hole and resiliently abuts the head portion of the bolt and a portion of the securing member in the concave.

Other advantages and novel features of the disclosure will be drawn from the following detailed description of the exemplary embodiments of the disclosure with attached drawings.

DETAILED DESCRIPTION OF THE EMBODIMENTS

Figure 1:
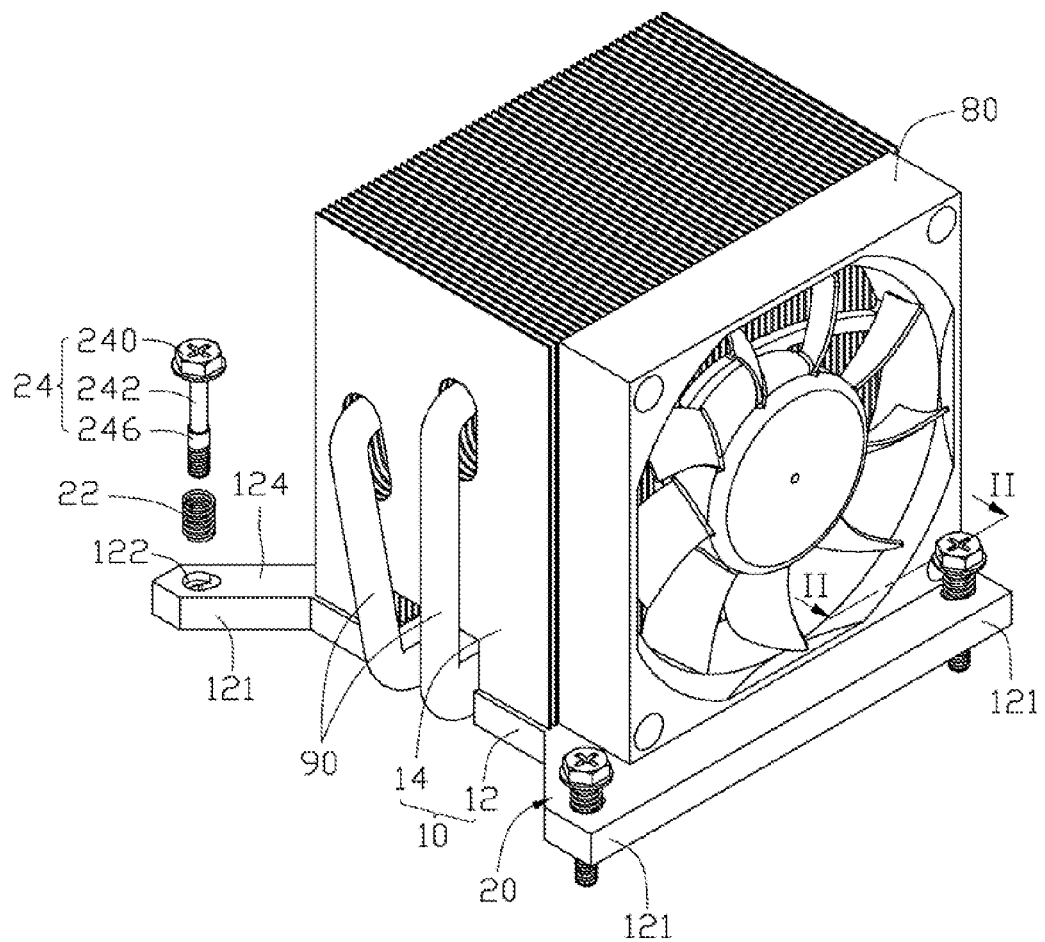
FIG. 1 is an isometric, assembled view of a heat dissipation device according to an exemplary embodiment.

Referring to FIG. 1, a heat dissipation device according to an exemplary embodiment includes a heat sink 10, two heat pipes 90, a cooling fan 80, and a number of fasteners 20.

The heat sink 10 includes a base 12 and a plurality of parallel fins 14 extending upwardly from the base 12. The base 12 is square-shaped, and is configured for thermally attaching to an electronic component (not shown) which is electronically connected to a circuit board (not shown). Each of the heat pipes 90 has one end embedded into the base 12 and another end extending through the fins 14. The fan 80 is arranged at a lateral side of the heat sink 10 for generating forced airflow. During operation, heat generated by the electronic component can be timely transferred to the fins 14 by the heat pipe 90. The forced airflow of the fan 80 flows through the fins 14 to take away the heat of the fins 14. Thus the heat of the electronic component can be dissipated timely, and the electronic component can be maintained to work at a relatively lower temperature.

Figure 2:
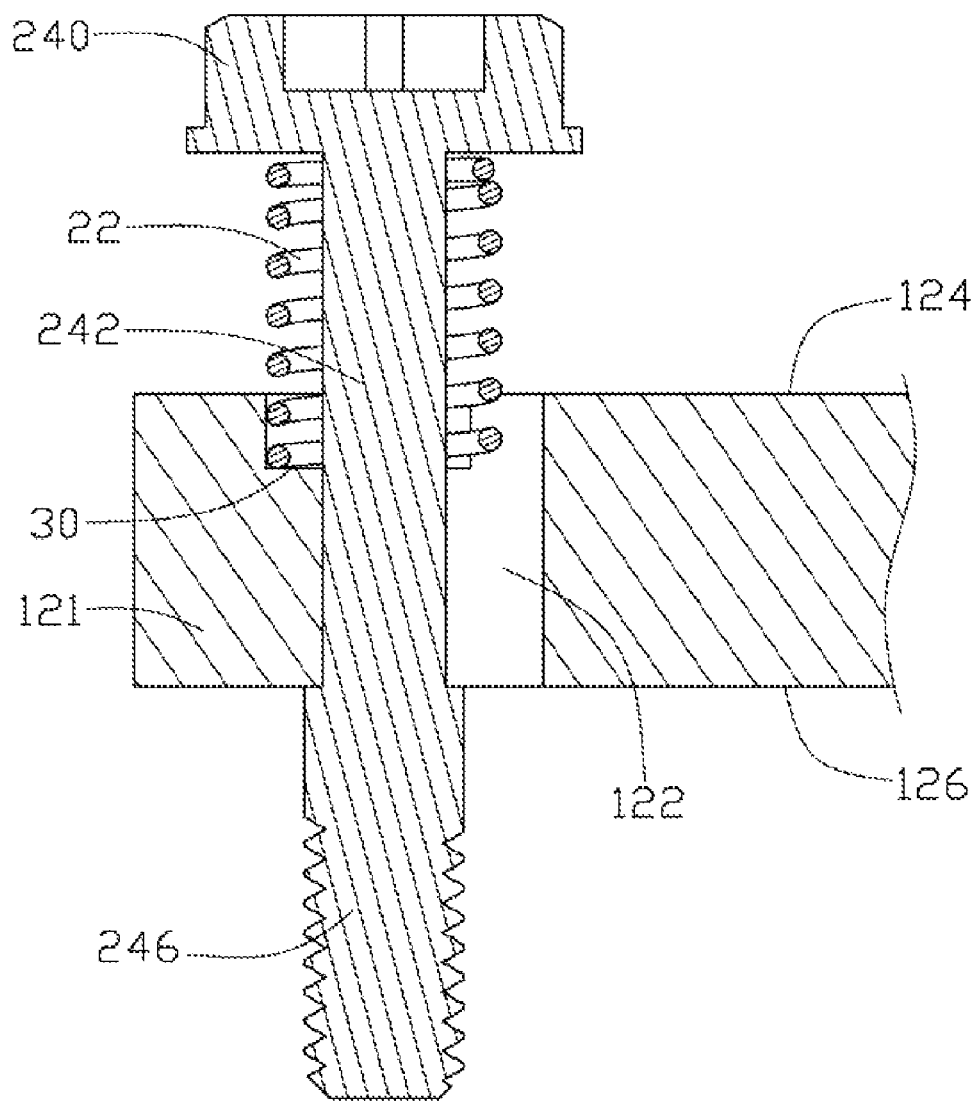
FIG. 2 is a cross section view of the heat dissipation device taken along line II-II of FIG. 1.

Referring to FIG. 2, a securing arm 121 extends outwardly from each corner of the base 12. A securing hole 122 is defined vertically through each securing arm 121 and located near a free end thereof. Each of the fasteners 20 extends through a corresponding securing hole 122 for engaging with the circuit board to assemble the heat dissipation device to the circuit board. Each fastener 20 includes a bolt 24 and a spring 22 mounted around the bolt 24. The bolt 24 has a glazed column-shaped main portion 242, a head portion 240 positioned at a top end of the main portion 242, and a threaded fixing portion 246 formed at a bottom end of the main portion 242. A length of the main portion 242 is greater than a thickness of the securing arm 121. The main portion 242 has a diameter smaller than that of the fixing portion 246. The diameter of the fixing portion 246 is smaller than that of the spring 22. The diameter of the spring 22 is smaller than that of the head portion 240.

Figure 3:
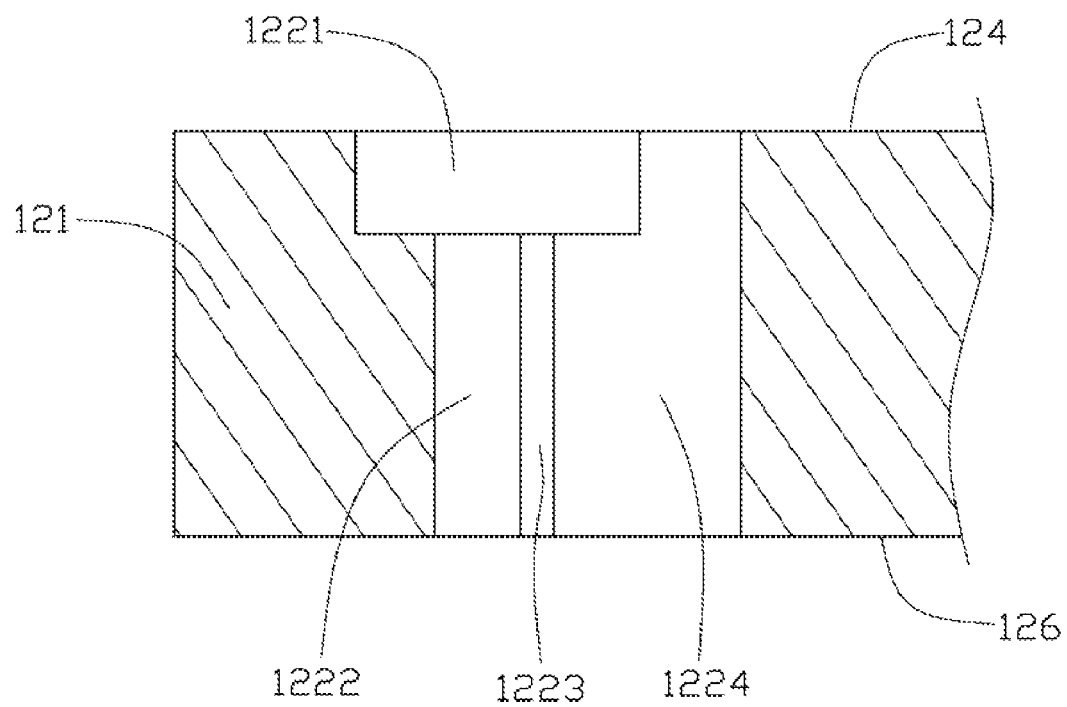
FIG. 3 is a cross section view of a securing arm of the heat dissipation device of FIG. 1.
Figure 4:
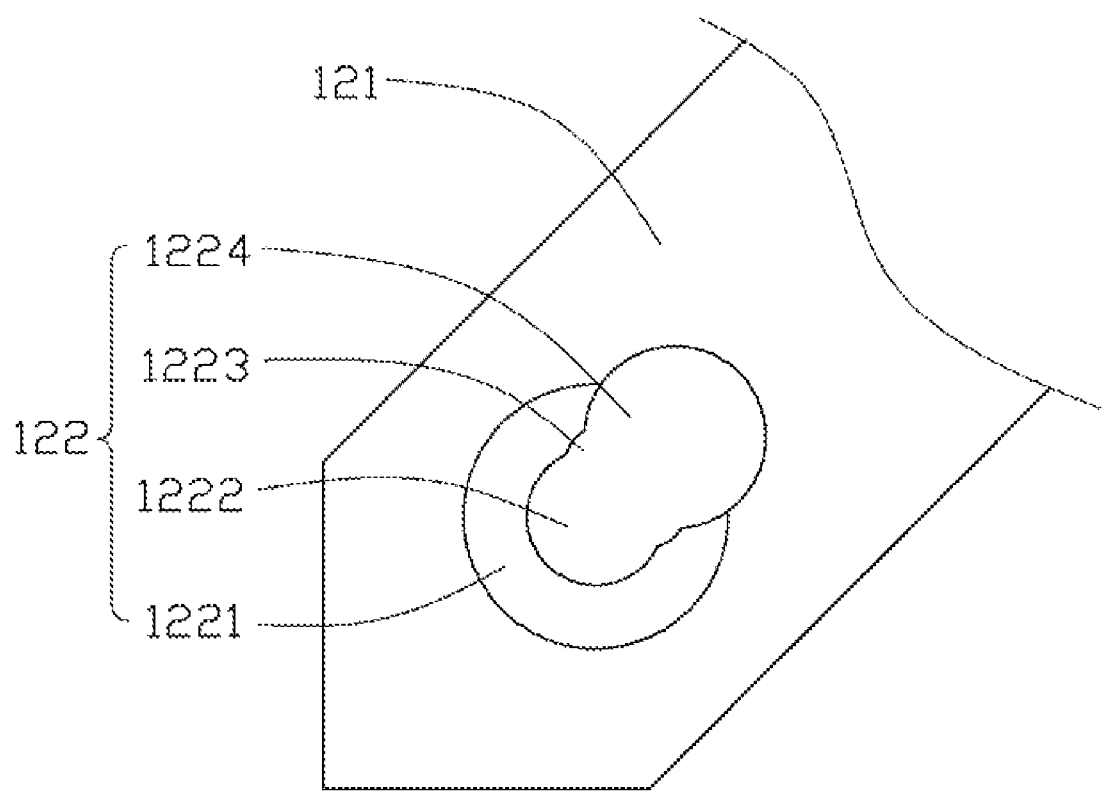
FIG. 4 is a top view of the securing arm of FIG. 3.

As shown in FIGS. 3-4, each securing hole 122 includes a large portion 1224, a small portion 1222, a connecting portion 1223, and a concave 1221. The large portion 1224, the small portion 1222, and the connecting portion 1223 extend through the securing arm 121. A diameter of the large portion 1224 is greater than the diameter of the fixing portion 246 of the bolt 24, and is smaller than a diameter of the spring 22. A diameter of the small portion 1222 is smaller than the diameter of the fixing portion 246, and is greater than the diameter of the main portion 242 of the bolt 24. The connecting portion 1223 is formed between the large portion 1224 and the small portion 1222, and interconnects the large portion 1224 and the small portion 1222. A minimum width of the connecting portion 1223 is substantially the same as the diameter of the main portion 242 of the bolt 24. Alternatively, the minimum width of the connecting portion 1223 can be a little greater than the diameter of the main portion 242 of the bolt 24.

The concave 1221 is depressed from a top side 124 of the securing arm 121 around the small portion 1222. A central axis of the concave 1221 is collinear with that of the small portion 1222. A diameter of the concave 1221 is approximately the same as that of the spring 22 of the fastener 20, and is smaller than that of the head portion 240 of the bolt 24. Alternatively, the diameter of the concave 1221 can be a little greater than the diameter of the spring 22. A depth of the concave 1221 is smaller than the thickness of the securing arm 121. A step 30 (FIG. 2) is thus formed by the securing arm 121 at a bottom of the concave 1221.

Referring to FIG. 2 again, in assembly of the heat dissipation device, the spring 22 is mounted to surround the main portion 242 of the bolt 24. The bolt 24 with the spring 22 mounted therearound is placed in the large portion 1224 of the corresponding securing hole 122 of the securing arm 121. The head portion 240 of the bolt 24 is pressed downwardly until the fixing portion 246 of the bolt 24 is below than a bottom side 126 the securing arm 121. As the diameter of the spring 22 is greater than the diameter of the large portion 1221 of the securing hole 122, the spring 22 is resiliently compressed between the top side 126 of the securing arm 122 and the head portion 240 of the bolt 24. Then the bolt 24 is moved transversely to the small portion 1222 via the connecting portion 1223 of the securing hole 122. As the minimum width of the connecting portion 1223 is not smaller than the diameter of the main portion 242 of the bolt 24, the main portion 242 can move through the connecting portion 1223 to reach the small portion 1222.

After the main portion 242 of the bolt 24 moving into the small portion 1222, the spring 22 extends downwardly into the concave 1221 of the securing hole 122. As the diameter of the spring 22 is approximately the same as that of the concave 1221 and is greater than the diameter of the large portion 1224 of the securing hole 122, the spring 22 abuts the securing arm 121 around the concave 1221 and is kept from moving into the large portion 1224. Therefore, the fasteners 20 can not move transversely to escape from the securing hole 122. Furthermore, the diameter of the small portion 1222 is smaller than that of the fixing portion 246; thus, when the bolt 24 is inserted into the small portion 1222 of the securing hole 122, the fixing portion 246 of the bolt 24 abuts against the bottom side 126 of the securing arm 121 and can not move upwardly into the small portion 1222. Therefore, the bolt 24 cannot be vertically moved relative to the securing arm 121. The bolts 24 thus are pre-assembled to the securing arms 121, and can not escape from the heat dissipation device.

When assembling the heat dissipation device to the electronic component, the head portion 240 of each bolt 24 is pressed and continuously rotated to cause the fixing portion 246 completely threadedly engaging with a back plate (not shown) of the circuit board. Thus, the electronic component is sandwiched between the circuit board and the heat dissipation device, and intimately contacts with the base 12 of the heat sink 10 for dissipation of heat.

In the embodiment, since the fasteners 20 can be assembled to the heat sink 10 directly, the fasteners 20 can have a simple structure and accordingly a low cost. The clipping members of the conventional art are not necessary in the present invention, and thus assembly of the clipping members to the bolts 24 is no longer needed. Accordingly, the present invention does not have the disadvantage of the conventional art that the clipping members may engage with the fixing portions and drop from the bolts. Finally, the assembly of the fasteners 20 to the heat sink 10 of the heat dissipation device can be more quickly completed than the conventional art. Moreover, as the diameter of the head portion 240 of the bolt 24 is greater than that of the spring 22, when the bolt 24 moves into the small portion 1222 of the securing hole 122, two opposite ends of the spring 22 resiliently abut against the step 30 of the securing arm 121 and the head portion 240 of the bolt 24, respectively. Thus, the fixing portion 246 tightly engages with the bottom side 126 of the securing arm 121 and an axial movement of the bolt 24 is limited. The bolt 24 is there by held still in the securing hole 122 and will not be easily disassembled from the preassembled position even during transportation.

Figure 5:
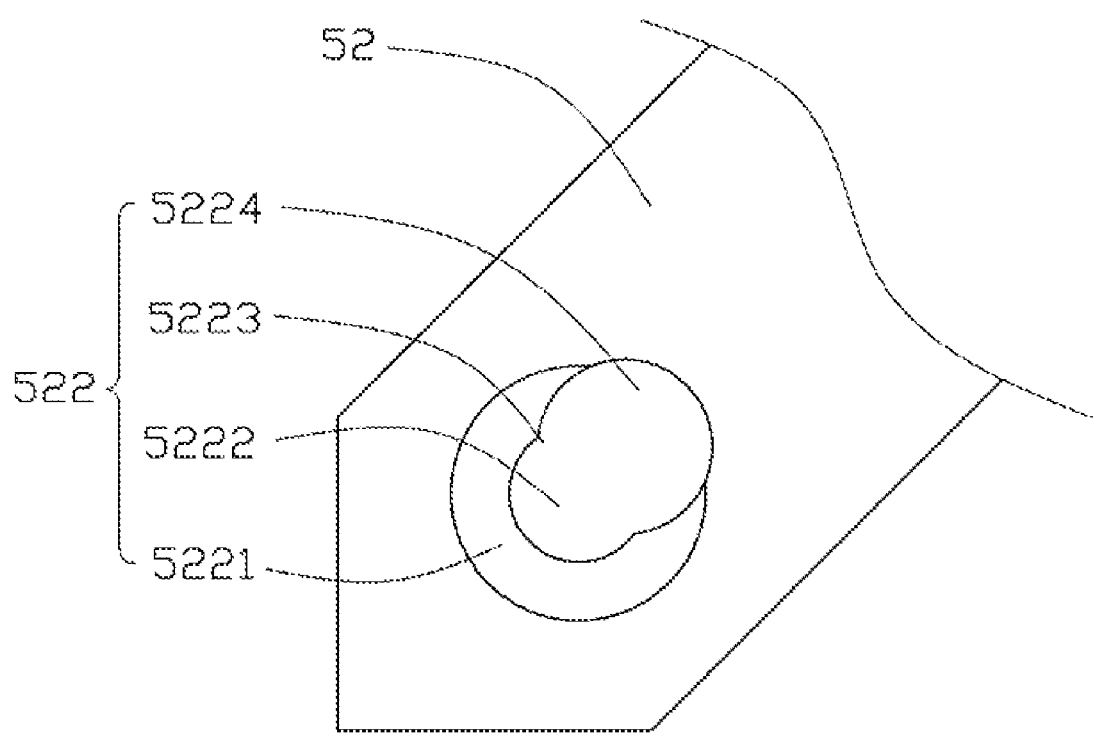
FIG. 5 is a top view of the securing arm according to an alternative embodiment.
Figure 6:
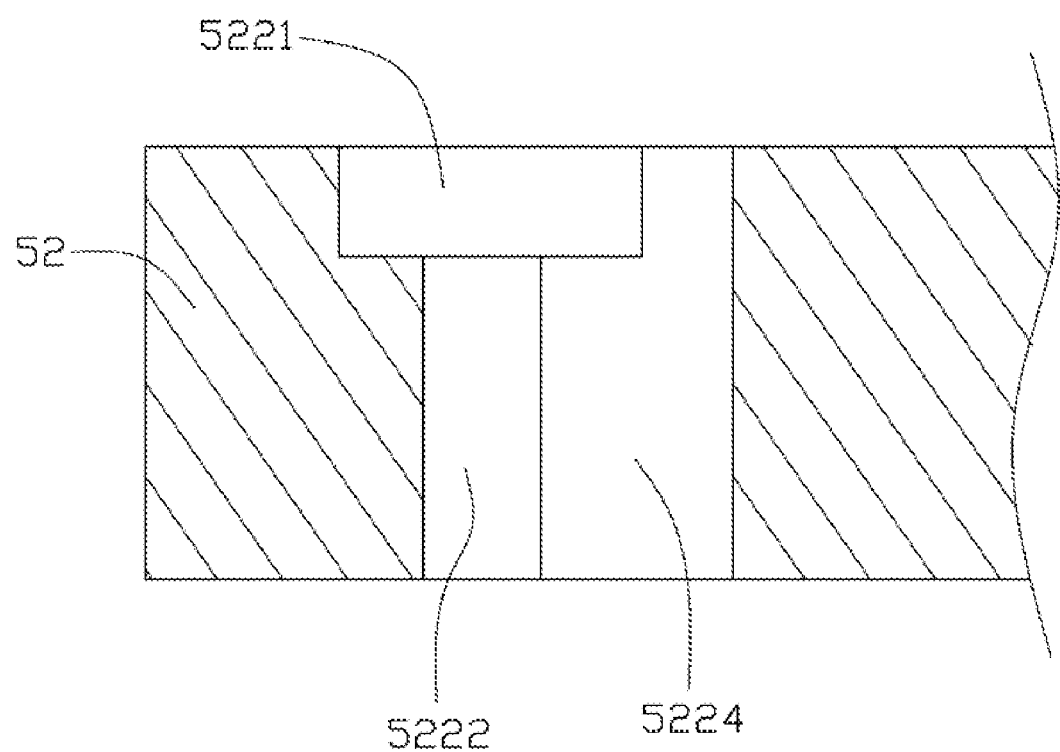
FIG. 6 is a cross section of the securing arm of FIG. 5.

Referring to FIGS. 5-6, an alternative embodiment of the securing arm 52 is shown. The difference of this embodiment over the previous embodiment is as follows. The connecting portion 1223 of the previous embodiment is omitted. The small portion 5222 and the large portion 5224 of the securing hole 522 directly connect with each other, and form two joints 5223 therebetween. A distance between the joints 5223 is not smaller than the diameter of the main portion 242 of the bolt 24. Thus the main portion 242 of the bolt 24 can move transversely from the large portion 5224 into the small portion 5222 directly. Similar to the previous embodiment, a concave 5221 is formed around the small portion 5222 with a diameter approximately the same as that of the spring 22 of the fastener 20 for receiving the spring 22.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device, comprising:
   a number of fasteners each comprising a bolt and a spring, the bolt comprising a main portion, a fixing portion formed at a bottom end of the main portion with a diameter greater than that of the main portion, and a head portion formed at a top end of the main portion with a diameter greater than that of the fixing portion, the spring being mounted around the main portion;
   a base forming a number of securing members, each securing member defining a securing hole therein for extension of a corresponding fastener therethrough, the securing hole comprising a large portion, a small portion communicating with the large portion, and a concave depressed from a top side of the securing member around the small portion, a diameter of the small portion being greater than that of the main portion and smaller than that of the fixing portion of the bolt, a diameter of the large portion being greater than that of the fixing portion and smaller than that of the spring, the main portion of the bolt extending through the small portion with the fixing portion abutting a bottom side of the securing member, the spring being received in the concave of the securing hole and resiliently abutting the head portion of the bolt and a portion of the securing member in the concave; and
   a plurality of parallel fins extending upwardly from the base.

2. The heat dissipation device of claim 1, wherein a step is formed by the securing member at a bottom of the concave, two opposite ends of the spring resiliently abutting the step of the securing member and the head portion of the bolt, respectively.

3. The heat dissipation device of claim 1, wherein a diameter of the concave is substantially the same as that of the spring, and a central axis of the concave is collinear with that of the small portion of the securing hole.

4. The heat dissipation device of claim 1, wherein a connecting portion is formed between the large portion and the small portion, a minimum width of the connecting portion being not smaller than the diameter of the main portion of the bolt.

5. The heat dissipation device of claim 1, wherein the base is square-shaped, the securing members extending outwardly from corners of the base.

6. The heat dissipation device of claim 1, further comprising at least a heat pipe having one end embedded into the base, and another end extending through the fins.

7. The heat dissipation device of claim 6, further comprising a cooling fan arranged at a lateral side of the fins for generating forced airflow to the fins.

8. A securing device, comprising:
a fastener comprising a bolt and a spring, the bolt comprising a main portion, a fixing portion formed at a bottom end of the main portion with a diameter greater than that of the main portion, and a head portion formed at a top end of the main portion with a diameter greater than that of the fixing portion, the spring being mounted around the main portion, a diameter of the spring being smaller than that of the head portion and greater than that of the fixing portion of the bolt; and a securing member defining a securing hole therein, the securing hole comprising a large portion, a small portion communicating with the large portion, and a concave depressed from a top side of the securing member around the small portion, a diameter of the small portion being greater than that of the main portion and smaller than that of the fixing portion of the bolt, a diameter of the large portion being greater than that of the fixing portion and smaller than that of the spring, the main portion of the bolt extending through the small portion with the fixing portion abutting a bottom side of the securing member, the spring being received in the concave of the securing hole and compressed between the head portion of the bolt and a portion of the securing member in the concave.

9. The securing device of claim 8, wherein a step is formed in the securing member at a bottom of the concave, two opposite ends of the spring resiliently abutting the step of the securing member and the head portion of the bolt, respectively.

10. The securing device of claim 8, wherein a diameter of the concave is substantially the same as that of the spring, and a central axis of the concave is collinear with that of the small portion of the securing hole.

11. The securing device of claim 8, wherein a connecting portion is formed between the large portion and the small portion, a minimum width of the connecting portion being not smaller than the diameter of the main portion of the bolt.

* * * * *